(12) United States Patent
Matsuda et al.

(10) Patent No.: US 7,528,530 B2
(45) Date of Patent: May 5, 2009

(54) PIEZOELECTRIC SUBSTANCE, PIEZOELECTRIC SUBSTANCE ELEMENT, LIQUID DISCHARGE HEAD, LIQUID DISCHARGE DEVICE AND METHOD FOR PRODUCING PIEZOELECTRIC SUBSTANCE

(75) Inventors: Takanori Matsuda, Chofu (JP); Katsumi Aoki, Yokohama (JP); Toshihiro Ifuku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 322 days.

(21) Appl. No.: 11/464,116

(22) Filed: Aug. 11, 2006

(65) Prior Publication Data
US 2007/0090728 A1    Apr. 26, 2007

(30) Foreign Application Priority Data
Aug. 23, 2005    (JP)    ............... 2005-241397

(51) Int. Cl.
*H01L 41/187*    (2006.01)
(52) U.S. Cl. ...................................... 310/358
(58) Field of Classification Search .......... 310/358
See application file for complete search history.

(56) References Cited

U.S. PATENT DOCUMENTS

| | | |
|---|---|---|
| 6,653,211 B2 | 11/2003 | Unno et al. |
| 6,854,832 B2 | 2/2005 | Matsuda |
| 6,927,084 B2 | 8/2005 | Fukui et al. |
| 7,045,935 B2 | 5/2006 | Matsuda et al. |
| 7,053,526 B2 | 5/2006 | Unno et al. |
| 7,059,711 B2 | 6/2006 | Aoto et al. |
| 7,120,978 B2 | 10/2006 | Wasa et al. |
| 7,144,101 B2 | 12/2006 | Ifuku et al. |
| 7,229,662 B2 * | 6/2007 | Wang et al. ............... 427/100 |
| 2003/0080329 A1 * | 5/2003 | Kurasawa et al. ............... 257/3 |
| 2004/0155559 A1 | 8/2004 | Ifuku et al. |
| 2004/0207288 A1 * | 10/2004 | Funakubo et al. ............ 310/311 |
| 2005/0122005 A1 | 6/2005 | Higuchi et al. |
| 2005/0127780 A1 | 6/2005 | Ifuku et al. |
| 2005/0168112 A1 | 8/2005 | Aoki et al. |
| 2005/0189849 A1 | 9/2005 | Ifuku et al. |
| 2005/0219793 A1 | 10/2005 | Matsuda et al. |
| 2006/0033404 A1 | 2/2006 | Fukui et al. |
| 2006/0049135 A1 | 3/2006 | Okabe et al. |

(Continued)

FOREIGN PATENT DOCUMENTS

JP    62-213399    9/1987

*Primary Examiner*—Jaydi SanMartin
(74) *Attorney, Agent, or Firm*—Fitzpatrick, Cella, Harper & Scinto

(57) ABSTRACT

A piezoelectric substance has a multi-layer structure consisting of single crystal layers or uniaxial crystal layers of a perovskite oxide expressed by the general formula of $ABO_3$ in which a main component at the site (A) is Pb, and a main component at the site (B) includes at least three elements selected from the group consisting of Mg, Zn, Sc, In, Yb, Ni, Nb, Ti and Ta. The multi-layer structure comprises a first crystal phase layer having any crystal structure selected from the group consisting of tetragonal, rhombohedral, pseudocubic, orthorhombic and monoclinic crystals; a second crystal phase layer having a different crystal structure from the crystal structure of the first crystal phase layer; and a boundary layer between the first crystal phase layer and the second crystal phase layer, and having a crystal structure gradually changing in a thickness direction of the layer.

11 Claims, 5 Drawing Sheets

U.S. PATENT DOCUMENTS

2007/0046152 A1 3/2007 Ifuku et al.
2007/0046153 A1 3/2007 Matsuda et al.
2007/0046154 A1 3/2007 Ifuku et al.
2007/0046734 A1 3/2007 Aoki et al.
2007/0048190 A1 3/2007 Ifuku et al.
2007/0060467 A1 3/2007 Matsuda et al.

* cited by examiner $T_1 \neq T_2 \neq T_3$

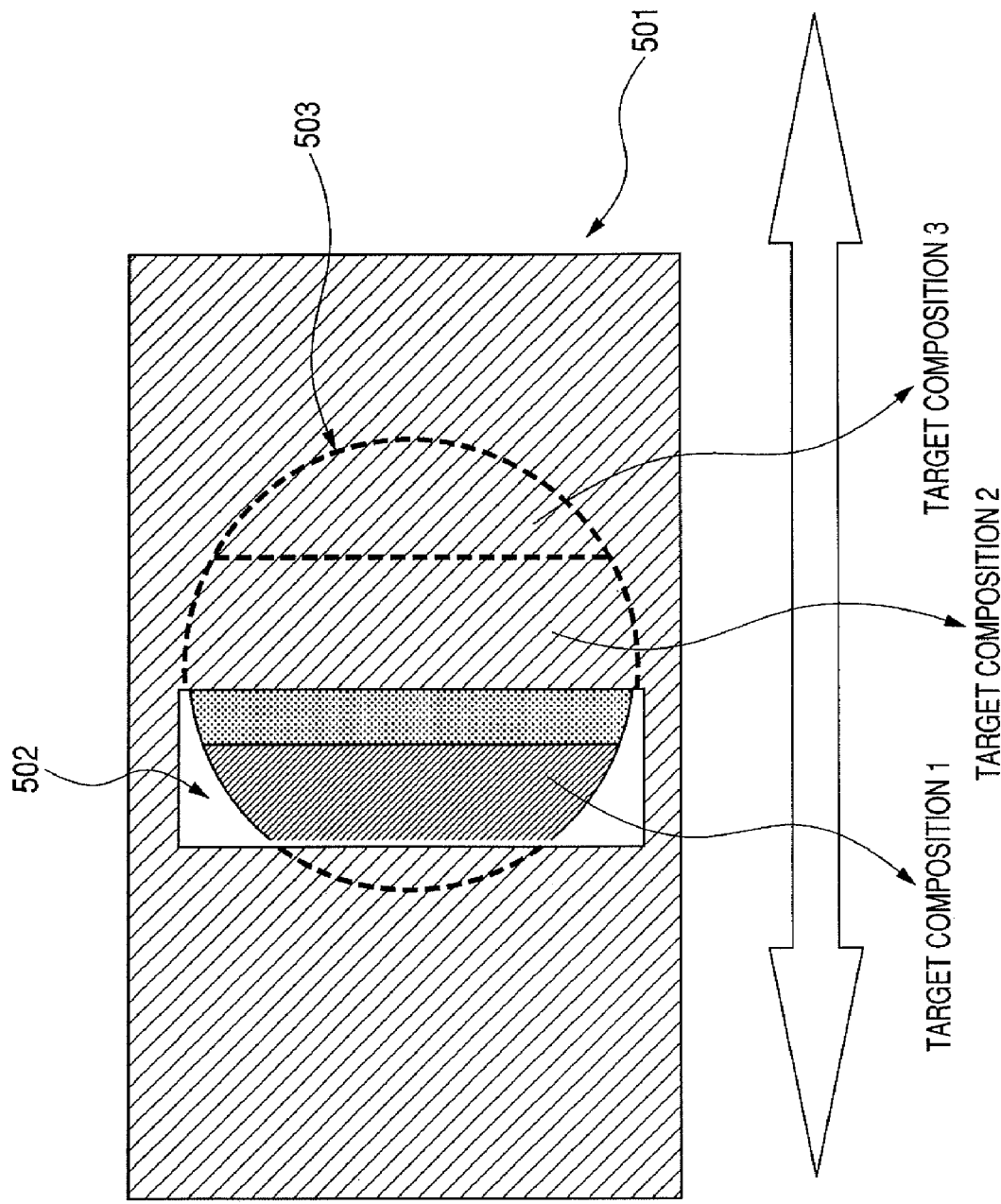

PIEZOELECTRIC SUBSTANCE, PIEZOELECTRIC SUBSTANCE ELEMENT, LIQUID DISCHARGE HEAD, LIQUID DISCHARGE DEVICE AND METHOD FOR PRODUCING PIEZOELECTRIC SUBSTANCE

BACKGROUND OF THE INVENTION

1. Field of the Invention

The present invention relates to a piezoelectric substance used in a liquid discharge device, a piezoelectric substance element, a liquid discharge head and a method for producing them. More specifically, the present invention relates to the piezoelectric substance element of a large area and high density, the liquid discharge head and the method for producing them.

2. Description of the Related Art

Higher resolution, and higher-speed printing, and further a longer length of a head have been demanded to an inkjet printer. For the purpose, a multi-nozzle head structure with a refined head has been demanded. It is necessary to miniaturize a piezoelectric substance element for discharging a liquid in order to refine the liquid discharge head, and further it is required for the piezoelectric substance to have such a high piezoelectric constant as not to decrease driving ability even when being refined, in order to miniaturize the piezoelectric substance element. For this reason, when the piezoelectric substance employs a piezoelectric substance film, the piezoelectric substance film is required to have superior crystallinity, in other words, to have the crystallinity controlled so as to make crystals highly oriented. In order to give the piezoelectric substance film the highly oriented crystallinity, it is preferable that an underlayer of a prepared piezoelectric substance film has higher crystallinity, and that the piezoelectric substance film and the underlayer have an adequate compatibility of lattice with each other. Besides, the piezoelectric substance film is required to have adequate adhesiveness to the underlayer so as not to cause peeling between the film and the underlayer, because the peeling tends to occur due to the stress applied in an interface, which has increased as the piezoelectric substance film becomes thin. A PZT piezoelectric material has been heretofore used for the piezoelectric substance film in the piezoelectric substance element, which is obtained by the steps of molding a paste of powders of PbO, $ZrO_2$ and $TiO_2$ into a sheet shape to form a green sheet, and sintering it, as is described in Japanese Patent Application Laid-Open No. S62-213399.

In addition, as for an piezoelectric material having higher piezoelectric characteristics than the above-described PZT piezoelectric material, there is a relaxor material such as Pb $(M_{1/3}N_{2/3})$ $O_3$ (M=Mg, Zn, Co, Ni, Mn, N=Nb, Ta), Pb $(M_{1/2}N_{1/2})$ $O_3$ (M=Sc, Fe, In, Yb, Ho, Lu, N=Nb, Ta), Pb $(M_{1/2}N_{1/2})$ $O_3$ (M=Mg, Cd, Mn, Co, N=W Re) and Pb $(M_{2/3}N_{1/3})$ $O_3$ (M=Mn, Fe, N=W, Re), as is disclosed in US2005/0122005A1.

However, a PZT oxide film according to a method disclosed in the above described Japanese Patent Application Laid-Open No. S62-213399 is hardly formed into a thickness of, for instance, 10 μm or smaller. In addition, the PZT oxide film has a problem that the piezoelectric substance film shrinks to about 70% when heated, because a green sheet is sintered at 1,000° C. or higher. Accordingly, the piezoelectric substance film is hardly aligned with a structure like an ink chamber in a dimensional accuracy of an order of several microns, so that a satisfactorily small piezoelectric substance element has not been realized yet.

Furthermore, a ceramic piezoelectric substance film formed by sintering a green sheet could not provide adequate piezoelectric characteristics, because as the film becomes thin, an effect of a crystal grain boundary becomes not negligible. As a result, even if the piezoelectric substance film with a thickness of 10 μm or less were prepared by sintering the green sheet, the piezoelectric substance film had a problem of not showing sufficient piezoelectric characteristics for discharging a recording liquid.

A thin film of 10 μm or smaller can be obtained by a sputtering method, a CVD method, a MBE method and a sol-gel process. However, the piezoelectric substance film produced by these methods has a problem of showing degraded adhesiveness of the film to a lower layer of a lower electrode, because the film acquires high density and consequently causes high in-plane stress in itself. A piezoelectric substance element of an inkjet head needs to have high adhesiveness between the piezoelectric substance film and the lower electrode of the lower layer, in order to bear stress generated by repetitive drive.

On the other hand, a relaxor material as is disclosed in US2005/0122005A1 has high piezoelectric characteristics, but the piezoelectric characteristics are highly temperature dependent, and the relaxor material also has a low Curie temperature. Accordingly, a piezoelectric element using the relaxor material needs to keep an operation environmental temperature constant, which does not meet reality and the piezoelectric element having low temperature dependency has not yet been in actual use.

SUMMARY OF THE INVENTION

An object of the present invention is to provide a piezoelectric substance which has highly controlled and oriented crystals, excellent piezoelectric characteristics, such a high adhesiveness between the piezoelectric substance and an electrode as to inhibit the peeling of the film, and high durability; a piezoelectric substance element using it; a liquid discharge head using it; and a liquid discharge device using it. Another object of the present invention is to provide the piezoelectric substance which does not degrade the piezoelectric characteristics even when a temperature of an operation environment varies; a piezoelectric substance element using it; a liquid discharge head using it; and a liquid discharge device using it. Yet another object of the present invention is to provide a method for producing a piezoelectric substance by means of microprocessing technology generally used in a semiconductor process; and a reliable liquid discharge head having nozzles formed at a high density by using this method. Specifically, the present invention relates to a piezoelectric substance having a multi-layer structure consisting of single crystal layers or uniaxial crystal layers of a perovskite oxide expressed by the general formula of $ABO_3$ in which a main component at the site (A) is Pb, and a main component at the site (B) includes at least three elements selected from the group consisting of Mg, Zn, Sc, In, Yb, Ni, Nb, Ti and Ta, wherein the multi-layer structure comprises: a first layer crystal phase having any crystal structure selected from the group consisting of tetragonal, rhombohedral, pseudocubis, orthorhombic and monoclinic crystals; a second layer crystal phase having any crystal structure selected from the group consisting of tetragonal, rhombohedral, pseudocubis, orthorhombic and monoclinic crystals, but different from the crystal structure of the first crystal phase; and a boundary layer between the first crystal phase and the second crystal phase, and having a crystal structure gradually changing in a thickness direction of the layer.

The present invention also relates to a piezoelectric element having such a piezoelectric substance and a liquid discharge head using it.

The present invention further relates to a method for producing a piezoelectric substance consisting of single crystal layers or uniaxial crystal layers of a perovskite oxide expressed by the general formula of $ABO_3$ with a sputtering technique comprising the steps of; arranging a target having a plurality of piezoelectric materials placed on its different regions; and sputtering the target while changing the region to be sputtered.

A piezoelectric, substance according to the present invention has high durability because of hardly causing the peeling of the film, high adhesiveness between the piezoelectric substance and a lower layer, high orientation caused by well controlled crystallinity and excellent piezoelectric characteristics, and can inhibit the piezoelectric characteristics from degrading even when a temperature of an operation environment varies. The piezoelectric substance also can exhibit the excellent piezoelectric characteristics when used in a piezoelectric substance element with high density and in a liquid discharge head.

A method for producing a piezoelectric substance according to the present invention can produce a piezoelectric substance of high reliability by using microprocessing technology generally used in a semiconductor process; a piezoelectric substance element of high density; and a liquid discharge head.

Further features of the present invention will become apparent from the following description of exemplary embodiments with reference to the attached drawings.

BRIEF DESCRIPTION OF THE DRAWINGS

FIG. 6 is a schematic block diagram showing a relationship between a target and a shutter in a sputtering apparatus to be used in a method for producing a piezoelectric substance according to the present embodiment.

DESCRIPTION OF THE EMBODIMENTS

A piezoelectric substance according to the present embodiment has a single crystal structure or uniaxial crystal structure of a perovskite oxide expressed by the general formula $ABO_3$. The above described piezoelectric substance has a multi-layer structure consisting of a plurality of the layered crystal phases each of which includes a crystal structure selected from tetragonal, rhombohedral, pseudocubis, orthorhombic and monoclinic crystals, and is different from another crystal phase. The piezoelectric substance further has a crystal phase (boundary layer) arranged between the above described different crystal phases, in which the crystal structure gradually changes in a thickness direction of a layer. The respective crystal phases are, for instance, epitaxially grown and have the multi-layer structure which shows a single crystal or uniaxial crystal structure as a whole.

Figure 1:
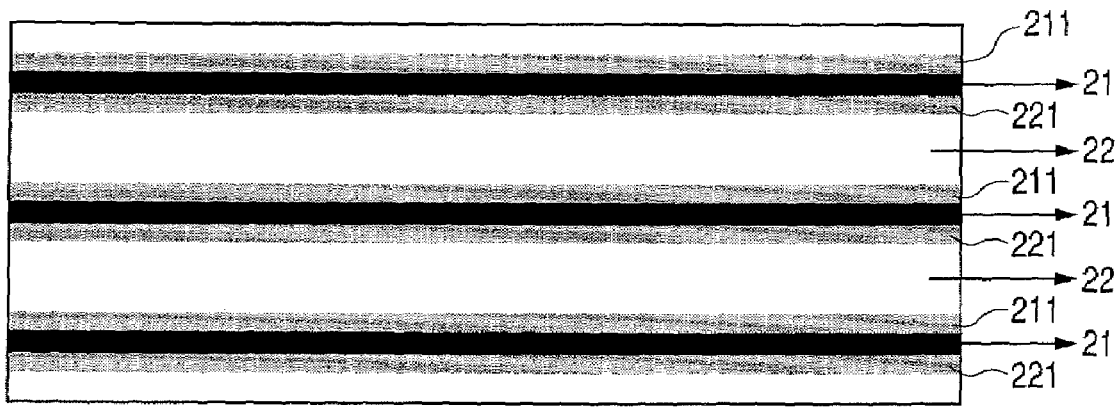
FIG. 1 is a schematic block diagram showing a layered configuration in one embodiment of a piezoelectric substance according to the present embodiment.

A layer having a crystal phase in which a crystal structure gradually changes in a thickness direction of the layer includes, as is shown in FIG. 1 for instance, boundary layers 211 and 221 of which the crystal structures gradually change, and which are arranged between a first crystal phase 21 and a second crystal phase 22 having certain crystal structures.

A boundary layer arranged between, for instance, a crystal phase 21 of a tetragon having a single crystal structure and a crystal phase 22 of a rhombohedral crystal having a single crystal structure has a crystal phase as will be described below. The boundary layer has a crystal phase 211 in which the crystal structure gradually changes from a tetragon to a rhombohedral crystal in a direction from a crystal phase 21 side to a crystal phase 22 side. The boundary layer further has a crystal phase 221 in which the crystal structure gradually changes from the rhombohedral crystal to the tetragon in a direction from the crystal phase 22 side to the crystal phase 21 side. Such a configuration can equally disperse distortion from a one-sided direction and absorb the dispersed distortion, and accordingly can inhibit a film having a thickness of a micron order and being prone to cause peeling from being peeled off by the distortive force. In other words, the configuration can provide a piezoelectric substance which has high adhesiveness between a piezoelectric substance film and an electrode, inhibits the film from peeling and shows high durability; further can mitigate the stress applied to each layer of the crystal phases; and further can improve the durability of the piezoelectric substance.

When a fracture such as a fine crack forms in a particular phase in a piezoelectric substance formed of a monolayer structure of the crystal phase, the crack may expand. However, a configuration according to the present embodiment has a multi-layer structure in which each layer has different Young's modulus from another layer, so that the crack produced in a layer having high Young's modulus hardly progresses to a next layer having the high Young's modulus over a layer having low Young's modulus. For this reason, the configuration makes the crack hardly expand, and accordingly can provide a piezoelectric substance having high durability as a whole.

In addition, crystal phases with different compositions in the configuration disperse the stress applied to films in themselves when the phase changes while the film is cooled from a film-forming temperature to room temperature in a film-forming process, and the films absorb the dispersed stress. Furthermore, a particular crystal phase in the configuration absorbs distortion in every particular temperature range, and provides adequate piezoelectric characteristics in a wide temperature range as a whole. In addition, a piezoelectric substance formed of a relaxor material having a low Curie temperature combined with a relaxor material having a high Curie temperature shows such sufficient piezoelectric characteristics so as not to deteriorate even when the environmental temperature varies.

The above described gradual change of a crystal structure in a boundary layer includes a mixed phase of the crystal structures of the crystal phase 21 and the crystal phase 22. The mixed phase means a phase formed of a single crystal or uniaxial crystal structure integrally composed of two or more crystal phases. In other words, the mixed phase is different from a phase containing a plurality of the crystal phases with respectively different crystal axis directions in a state of a polycrystal and their grain boundaries as well, but a phase containing a plurality of crystal phases in a particle of a perovskite oxide. The mixed phase preferably forms an integrated crystal.

A crystal phase composing such a multi-layer structure is preferably a crystal phase formed of a perovskite oxide $ABO_3$. In such a perovskite oxide $ABO_3$, it is preferable that a main component for (A) includes Pb and a main component for (B) includes three or more elements selected from Mg, Nb, Sc, In, Yb, Ni, Ta, Ti and Zn. The perovskite oxide containing three or more elements acquires preferable phase boundaries.

Specifically, seven oxide perovskite oxides are shown below.

A perovskite oxide (I) is a $(Pb_{km}\alpha_{lm})_{xm}(Mg_{mm}Nb_{nm}Ti_{om}\beta_{pm})_{ym}O_3$ type, wherein the suffixes satisfy all the expressions of $1 \leq xm/ym < 1.5$, $km+lm=1$, $0.7 \leq km \leq 1$, $0 \leq lm < 0.3$, $mm+nm+om+pm=1$, $0.1 < mm < 0.3$, $0.3 < nm < 0.5$, $0.2 < om < 0.4$ and $0 \leq pm < 0.3$; $\alpha$ includes any element of La, Ca, Ba, Sr, Bi or Sb; and $\beta$ includes any element of Pb, Sc, In, Yb, Ni, Ta, Co, W, Fe, Sn or Zn. The perovskite oxide (I) forms a pseudocubis crystal and a tetragon.

A perovskite oxide (II) is a $(Pb_{kz}\alpha_{lz})_{xz}(Zn_{mz}Nb_{nz}Ti_{oz}\beta_{pz})_{yz}O_3$ type, wherein the suffixes satisfy all the expressions of $1 \leq xz/yz < 1.5$, $kz+lz=1$, $0.7 \leq kz \leq 1$, $0 \leq lz \leq 0.3$, $mz+nz+oz+pz=1$, $0.2 < mz < 0.4$, $0.5 < nz < 0.7$, $0.05 < oz < 0.20$ and $0 \leq pz < 0.3$; $\alpha$ includes any element of La, Ca, Ba, Sr, Bi or Sb; and $\beta$ includes any element of Pb, Sc, In, Yb, Mg, Ta, Co, W, Fe, Sn or Ni. The perovskite oxide (II) forms a pseudocubis crystal and a tetragon.

A perovskite oxide (III) is a $(Pb_{kn}\alpha_{ln})_{xn}(Ni_{mn}Nb_{nn}Ti_{on}\beta_{pn})_{yn}O_3$ type, wherein the suffixes satisfy all the expressions of $1 \leq xn/yn < 1.5$, $kn+ln=1$, $0.7 \leq kn \leq 1$, $0 \leq ln \leq 0.3$, $mn+nn+on+pn=1$, $0.1 < mn < 0.3$, $0.3 < nn < 0.5$, $0.3 < on < 0.5$ and $0 \leq pn < 0.3$; $\alpha$ includes any element of La, Ca, Ba, Sr, Bi or Sb; and $\beta$ includes any element of Pb, Sc, In, Yb, Mg, Ta, Co, W, Fe, Sn or Zn. The perovskite oxide (III) forms a pseudocubis crystal and a tetragon.

A perovskite oxide (IV) is a $(Pb_{kt}\alpha_{lt})_{xt}(Sc_{mt}Ta_{nt}Ti_{ot}\beta_{pt})_{yt}O_3$ type, wherein the suffixes satisfy all the expressions of $1 \leq xt/yt < 1.5$, $kt+lt=1$, $0.7 \leq kt \leq 1$, $0 \leq lt \leq 0.3$, $mt+nt+ot+pt=1$, $0.1 < mt < 0.4$, $0.1 < nt < 0.4$, $0.3 < ot < 0.5$ and $0 \leq pt < 0.3$; $\alpha$ includes any element of La, Ca, Ba, Sr and Bi; and $\beta$ includes any element of Pb, Nb, In, Yb, Mg, Ni, Co, W, Fe, Sn or Zn. The perpvskite oxide (IV) forms a pseudocubic crystal and a tetragon.

A perovskite oxide (V) is a $(Pb_{ks}\alpha_{ls})_{xs}(Sc_{ms}Nb_{ns}Ti_{os}\beta_{ps})_{ys}O_3$ type, wherein the suffixes satisfy $1 \leq xs/ys < 1.5$, $ks+ls=1$, $0.7 \leq ks \leq 1$, $0 \leq ls \leq 0.3$, $ms+ns+os+ps=1$, $0.1 < ms < 0.4$, $0.1 < ns < 0.4$, $0.3 < os < 0.5$ and $0 \leq ps < 0.3$; $\alpha$ includes any element of La, Ca, Ba, Sr, Bi or Sb; and $\beta$ includes any element of Pb, Ta, In, Yb, Mg, Ni, Co, W, Fe, Sn or Zn. The perovskite oxide (V) forms a rhombohedral crystal and a tetragon.

A perovskite oxide (VI) is a $(Pb_{ky}\alpha_{ly})_{xy}(Yb_{my}Nb_{ny}Ti_{oy}\beta_{py})_{yy}O_3$ type, wherein the suffixes satisfy all the expressions of $1 \leq xy/yy < 1.5$, $ky+ly=1$, $0.7 \leq ky \leq 1$, $0 \leq ly \leq 0.3$, $my+ny+oy+py=1$, $0.1 < my < 0.4$, $0.1 < ny < 0.4$, $0.4 < oy < 0.6$ and $0 \leq py < 0.3$; $\alpha$ includes any element of La, Ca, Ba, Sr, Bi or Sb; and $\beta$ includes any element of Pb, Sc, In, Ta, Mg, Ni, Co, W, Fe, Sn or Zn. The perovskite oxide (VI) forms a monocline and a tetragon.

A perovskite oxide (VII) is a $(Pb_{ki}\alpha_{li})_{xi}(In_{mi}Nb_{ni}Ti_{oi}\beta_{pi})_{yi}O_3$ type, wherein the suffixes satisfy all the expressions of $1 \leq xi/yi < 1.5$, $ki+li=1$, $0.7 \leq ki \leq 1$, $0 \leq li \leq 0.3$, $mi+ni+oi+pi=1$, $0.2 < mi < 0.4$, $0.2 < ni < 0.4$, $0.2 < oi < 0.5$ and $0 \leq pi < 0.3$; $\alpha$ includes any element of La, Ca, Ba, Sr, Bi or Sb; and $\beta$ includes Pb, Sc, In, Yb, Mg, Ni, Co, W, Fe, Sn and Zn. The perovskite oxide (VII) forms a pseudocubis crystal and a tetragon.

It is considered that the perovskite oxide having an elemental composition according to the above described (I) to (VII) is located in the vicinity of a morphotropic phase boundary (popularly called MPB), and accordingly can possess a plurality of crystal phases in the perovskite oxide having a single crystal structure or a uniaxial crystal structure. It is considered that as a result, the perovskite oxide can form a boundary layer therein, forms a uniform film, provides high piezoelectric characteristics and possesses high relative dielectric constant.

In a multi-layer structure of a piezoelectric substance according to the present embodiment, at least two layers of the respective crystal phases have preferably different thicknesses. An example can be a piezoelectric substance shown in FIG. 2, which has a crystal phase 31 with the film thickness of $T_1$, a crystal phase 32 with the film thickness of $T_2$ and a crystal phase 33 with the film thickness of $T_3$, where the film thicknesses $T_1$, $T_2$ and $T_3$ are different from each other. The respective crystal phases have the boundary layers (311, 321 and 331) between them, of which the crystal structure gradually changes as shown in FIG. 1. Here, the film thicknesses $T_1$, $T_2$ and $T_3$ show distances from a center of the boundary layer to the center of the next boundary layer. In the piezoelectric substance having such a multi-layer structure, the layer of the crystal phase most suitable for a condition in which the piezoelectric substance is used preferably has sufficient film thickness. In the piezoelectric substance, the layer of another crystal phase can mitigate applied stress. The piezoelectric substance having different thickness between crystal phases can make itself fit to an operating environment, by allocating each thickness to each crystal phase according to the operating condition. In the boundary layer, the composition preferably gradually changes, but may have a mixed composition of each crystal phase contacting with the boundary layer.

Each crystal phase which forms a multi-layer structure of the piezoelectric substance according to the present embodiment preferably has a film thickness of 1 nm or more but 1,000 nm or less. When the film thickness is 1 nm or more, the piezoelectric substance can provide sufficient piezoelectric characteristics. When the film thickness is 1,000 nm or less, the piezoelectric substance can inhibit a film having the multi-layer structure from peeling due to the stress applied with in the surface.

[Piezoelectric Substance Element]

Figure 3:
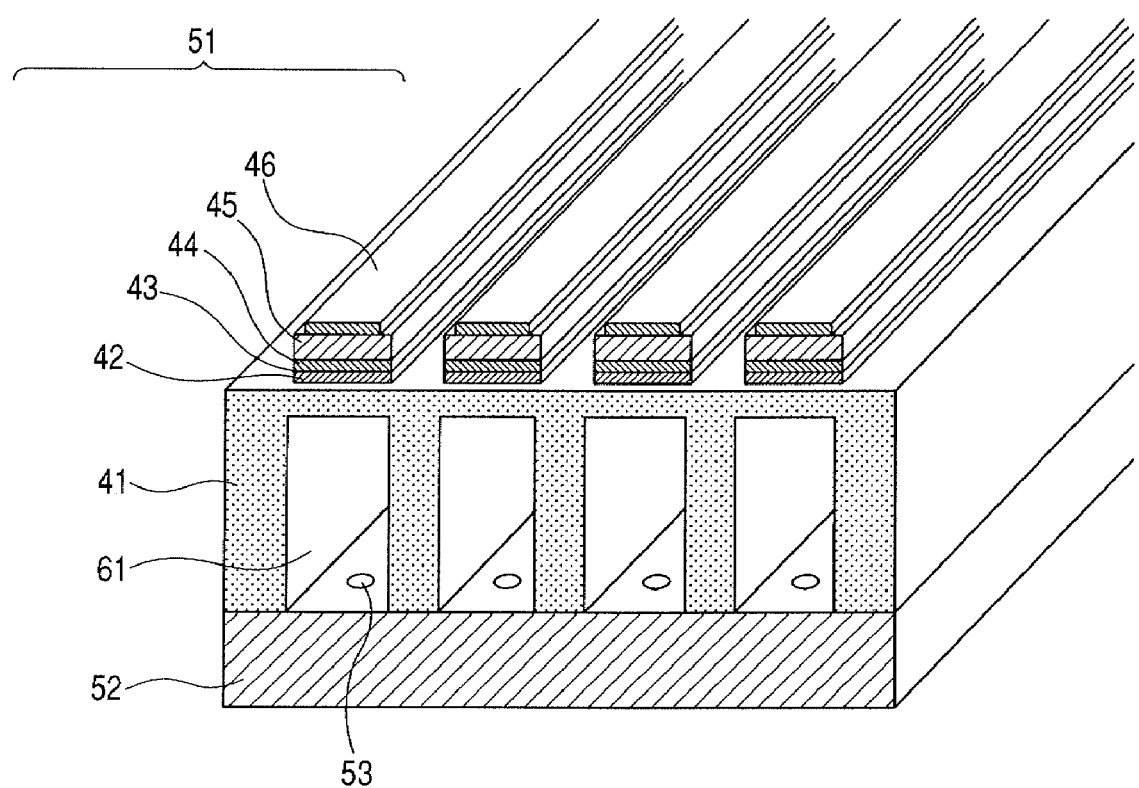
FIG. 3 is a view showing a cross section structure of one embodiment of a liquid discharge head according to the present embodiment.

A piezoelectric substance element according to the present embodiment is not limited in particular as long as it has the above-described piezoelectric substance of the present embodiment and a pair of electrodes installed so as to be in contact with the piezoelectric substance. One example of a piezoelectric substance element according to the present embodiment is a piezoelectric substance element 51 having a multi-layer structure consisting of a base 41, a vibration plate 42, a buffer layer 43, a lower electrode 44, the piezoelectric substance 45 and an upper electrode 46 sequentially stacked, as is shown in FIG. 3.

A base in a piezoelectric substance element according to the present embodiment is preferably made of a material having adequate crystallinity. The preferred material is Si, and specifically includes SOI having a $SiO_2$ film formed on Si. The base can have a thickness of, for instance, 100 to 1,000 μm. The above described vibration plate is placed in order to transmit the displacement of the piezoelectric substance, and has preferably high lattice conformity with the base and sufficiently high Young's modulus so as to function as the vibration plate. When the substrate is made from silicon oxide, the vibration plate is preferably made from, for instance, stabilized zirconia. When SOI is employed as the base, a $SiO_2$ layer on a Si single crystal layer may be used as the vibration plate. An vibration unit can have a thickness of, for instance, 2 to 10 μm.

The above-described buffer layer is placed in order to match lattice conformity of a crystal lattice constant of a base with that of the piezoelectric substance, and can be eliminated when the base has adequate lattice conformity with the piezoelectric substance. The buffer layer may have a multi-layer structure consisting of a plurality of layers to achieve its function. The buffer layer is preferably made from a material having high crystal lattice conformity with that of a vibration plate right beneath it. When the base is made from silicon, the buffer layer can be made from, for instance, stabilized zirconia YSZ ($Y_2O_3$—$ZrO_2$), $CeO_2$ or the like.

The above described lower electrode may be arranged right above a buffer layer 43 or in between a vibration plate 42 and the buffer layer 43. When a piezoelectric substance element does not arrange the buffer layer, the lower electrode may function also as the buffer layer. In the case, the lower electrode may be arranged on the vibration plate through an adherent layer so as to improve adhesiveness of the lower electrode with the vibration plate. As for a material of the lower electrode, a metal of a platinum group or an electroconductive oxide-based material is preferable. The material of the lower electrode includes, specifically, a platinum group metal such as Ru, Rh, Pd, Os, Ir and Pt; and an electroconductive oxide-based material such as $SrRuO_3$, $BaPbO_3$ and $RuO_3$. The material for the adherent layer includes a metal such as Ti, Cr and Ir; and an oxide thereof such as $TiO_2$ and $IrO_2$.

The lower electrode 44 affects the orientation of crystals in the piezoelectric substance arranged thereon, so that the predominant orientation of the crystals in a substrate surface is preferably any of (010), (101), (110) and (111). When the predominant orientation of the crystals on the substrate surface of the lower electrode is (010), (101), (110) or (111), the piezoelectric substance 45 stacked thereon has any of (100), (001), (010), (101), (110) and (111) as the predominant orientation of the crystals. In addition, the piezoelectric substance 45 shows particularly adequate piezoelectric characteristics when having the predominant orientation of the crystals of (001) or (111), so that the substrate surface of the lower electrode preferably has the predominant orientation of the crystals of (001) or (111).

A metallic thin film or a thin film of electroconductive oxide material composing the lower electrode has preferably a crystal orientation ratio of 70% or higher. The crystal orientation ratio means a ratio of the peak intensity for a crystal having particular orientation to the total peak intensities for all crystals in the film when it is subjected to θ-2θ measurement by XRD (X-ray diffraction). When the metallic thin film for the electrode has the crystal orientation ratio of 70% or higher, the lower electrode has adequate electrical characteristics and the piezoelectric substance 45 to be arranged thereon has excellent crystallinity. The metallic thin film or the thin film of the electroconductive oxide material of the lower electrode further preferably has the crystal orientation ration of 85% or higher. The lower electrode also has a film thickness preferably of 100 nm to 1,000 nm. The adherent layer has the film thickness preferably of 5 nm to 300 nm, and further preferably of 10 to 70 nm.

A piezoelectric substance to be used in a piezoelectric substance element according to the present embodiment is the piezoelectric substance according to the above described present embodiment. The piezoelectric substance has a film thickness preferably of 100 nm or more but 10 μm or less, and further preferably of 500 nm or more but 8 μm or less. When the piezoelectric substance has the film thickness of 100 nm or more, a liquid discharge head with the use of the piezoelectric substance element shows durability against stress generated by repetitive drive. When the piezoelectric substance has the film thickness of 10 μm or less, it can inhibit the film from peeling.

The above described upper electrode 46 is arranged right above a piezoelectric substance 45 and applies electric charge to the piezoelectric substance while cooperating with a lower electrode. An adherent layer made from the same material as, the adherent layer arranged between the above described lower electrode and a vibration plate may be arranged also between the upper electrode and the piezoelectric substance. The material of the upper electrode 46 can include the same material as in the lower electrode.

Such a piezoelectric substance element according to the present embodiment can have the layer structure including specifically the following examples. The layer structure is shown like upper electrode 46//piezoelectric substance 45// lower electrode 44//vibration plate 42, and a symbol (/) means that the layers in front of and after the symbol are different multi-layer structures.

Case 1:
Pt/Ti//$PbMgNbO_3$—$PbTiO_3$/$PbNiNbO_3$—$PbTiO_3$/Pb-$MgNbO_3$—$PbTiO_3$/$PbNiNbO_3$—$PbTiO_3$//Pt/Ti//YSZ ($Y_2O^3$—$ZrO_2$)/Si Case 2:
Pt/Ti//$PbMgNbO_3$—$PbTiO_3$/$PbNiNbO_3$—$PbTiO_3$/Pb-$MgNbO_3$—$PbTiO_3$/$PbNiNbO_3$—$PbTiO_3$//$SrRuO_3$/Pt//YSZ ($Y_2O_3$—$ZrO_2$)/Si Case 3:
Pt/Ti//$PbZnNbO_3$—$PbTiO_3$/$PbScTaO_3$—$PbTiO_3$/$PbZnNbO_3$—$PbTiO_3$/$PbScTaO_3$—$PbTiO_3$//Pt/Ti//YSZ($Y_2O_3$—$ZrO_2$)/Si Case 4:
Pt/Ti//$PbZnNbO_3$—$PbTiO_3$/$PbScTaO_3$—$PbTiO_3$/$PbZnNbO_3$—$PbTiO_3$/$PbScTaO_3$—$PbTiO_3$//$SrRuO_3$/Pt//YSZ ($Y_2O_3$—$ZrO_2$)/Si Case 5:
Pt/Ti//$PbYbNbO_3$—$PbTiO_3$/$PbInNbO_3$—$PbTiO_3$/$PbYbNbO_3$—$PbTiO_3$/$PbInNbO_3$—$PbTiO_3$//Pt/Ti//YSZ($Y_2O_3$—$ZrO_2$)/Si Case 6:
Pt/Ti//$PbYbNbO_3$—$PbTiO_3$/$PbInNbO_3$—$PbTiO_3$/$PbYbNbO_3$—$PbTiO_3$/$PbInNbO_3$—$PbTiO_3$//$SrRuO_3$/Pt//YSZ ($Y2O_3$—$ZrO_2$)/Si Case 9:
Pt/Ti//$PbZnNbO_3$—$PbTiO_3$/$PbScTaO_3$—$PbTiO_3$/$PbNiNbO_3$—$PbTiO_3$/$PbZnNbO_3$—$PbTiO_3$/$PbScTaO_3$—$PbTiO_3$/$PbNiNbO_3$—$PbTiO_3$//Pt/Ti//YSZ($Y_2O_3$—$ZrO_2$)/Si Case 10:
Pt/Ti//$PbZnNbO_3$—$PbTiO_3$/$PbScTaO_3$—$PbTiO_3$/$PbNiNbO_3$—$PbTiO_3$/$PbZnNbO_3$—$PbTiO_3$/$PbScTaO_3$—$PbTiO_3$/$PbNiNbO_3$—$PbTiO_3$//$SrRuO_3$/Pt//YSZ ($Y_2O_3$—$ZrO_2$)/Si Case 11:
Pt/Ti//$PbMgNbO_3$—$PbTiO_3$/$PbNiNbO_3$—$PbTiO_3$/$PbYbNbO_3$—$PbTiO_3$/$PbInNbO_3$—$PbTiO_3$/$PbMgNbO_3$—Pb- TiO$_3$/PbNiNbO$_3$—PbTiO$_3$/PbYbNbO$_3$—PbTiO$_3$/PbIn-NbO$_3$—PbTiO$_3$//Pt/Ti//YSZ(Y$_2$O$_3$—ZrO$_2$)/Si Case 12:
Pt/Ti//PbMgNbO$_3$—PbTiO$_3$/PbNiNbO$_3$—PbTiO$_3$/PbYb-NbO$_3$—PbTiO$_3$/PbInNbO$_3$—PbTiO$_3$/PbMgNbO$_3$—PbTiO$_3$/PbNiNbO$_3$—PbTiO$_3$/PbYbNbO$_3$—PbTiO$_3$/PbInNbO$_3$—PbTiO$_3$//SrRuO$_3$/Pt//YSZ(y$_2$O$_3$—ZrO$_2$)/Si Case 13:
Pt/Ti//PbMgNbO$_3$—PbTiO$_3$/PbNiNbO$_3$—PbTiO$_3$/PbMgNbO$_3$—PbTiO$_3$/PbNiNbO$_3$—PbTiO$_3$/PbMgNbO$_3$—PbTiO$_3$/PbNiNbO$_3$—PbTiO$_3$/PbMgNbO$_3$—PbTiO$_3$/PbNiNbO$_3$—PbTiO$_3$//Pt/Ti//YSZ(y$_2$O$_3$—ZrO$_2$)/Si Case 14:
Pt/Ti//PbZnNbO$_3$—PbTiO$_3$/PbScTaO$_3$—PbTiO$_3$/PbZnNbO$_3$—PbTiO$_3$/PbScTaO$_3$—PbTiO$_3$/PbZnNbO$_3$—PbTiO$_3$/PbScTaO$_3$—PbTiO$_3$/PbZnNbO$_3$—PbTiO$_3$/PbScTaO$_3$—PbTiO$_3$/PbZnNbO$_3$—PbTiO$_3$/PbScTaO$_3$—PbTiO$_3$/PbZnNbO$_3$—PbTiO$_3$/PbScTaO$_3$—PbTiO$_3$//SrRuO$_3$/Pt//YSZ(Y2O$_3$—ZrO$_2$)/Si

[Liquid Discharge Head]

A liquid discharge head according to the present embodiment is not limited in particular as long as it has a nozzle, a separate liquid chamber communicating with the nozzle, a piezoelectric substance element according to the present embodiment arranged so as to correspond with the separate liquid chamber, and a vibration plate arranged between the separate liquid chamber and the piezoelectric substance element. One example of the liquid discharge head according to the present embodiment can include the inkjet head shown in FIG. 3. The inkjet head has a base 41 and pressure chambers 61 of a plurality of separate liquid chambers arranged in parallel to the base. Each pressure chamber is provided with a liquid nozzle 53, the piezoelectric substance element 51, and a vibration plate 42 arranged between the pressure chamber and the piezoelectric substance element. In the inkjet head, the nozzles 53 are formed at a predetermined spacing in a nozzle plate 52 placed in the bottom of the base 41, but they can be arranged at a side face of the pressure chamber.

The above described piezoelectric substance elements 51 are arranged, as an example, on the top surface of a base 41 so as to respectively correspond with pressure chambers 61. Each piezoelectric substance element 51 is composed of a layered body, as an example, in which a buffer layer 43, a lower electrode 44, a piezoelectric substance 45 of a thin film for a piezoelectric substance, and an upper electrode 46 are sequentially stacked.

A liquid discharge head according to the present embodiment makes a nozzle discharge a liquid in a separate liquid chamber through a volumetric change of the separate liquid chamber, which has been caused by a vibration plate to which the displacement of a piezoelectric substance is transmitted.

A liquid discharge head according to the present embodiment can be applied to a liquid discharge portion of a device for discharging various liquids, in addition to an ink-jet head.

A liquid discharge head according to the present embodiment employs a piezoelectric substance element having a vibration plate, and a buffer layer, a piezoelectric element, a lower electrode, a piezoelectric substance and an upper electrode composing a piezoelectric element, arranged on a base, and they are formed of crystals all having the same orientation. Accordingly, the respective piezoelectric substance elements have little variation in performance. For this reason, the liquid discharge head can be a device having the layers with high adhesion, and further can provide piezoelectric characteristics and mechanical characteristics sufficient for miniaturizing the device. The liquid discharge head also shows excellent durability, because the piezoelectric substance element has improved durability by employing a piezoelectric substance formed of highly oriented crystals.

[Liquid Discharge Device]

A liquid discharge device according to the present embodiment has a liquid discharge head according to the present embodiment.

Figure 4:
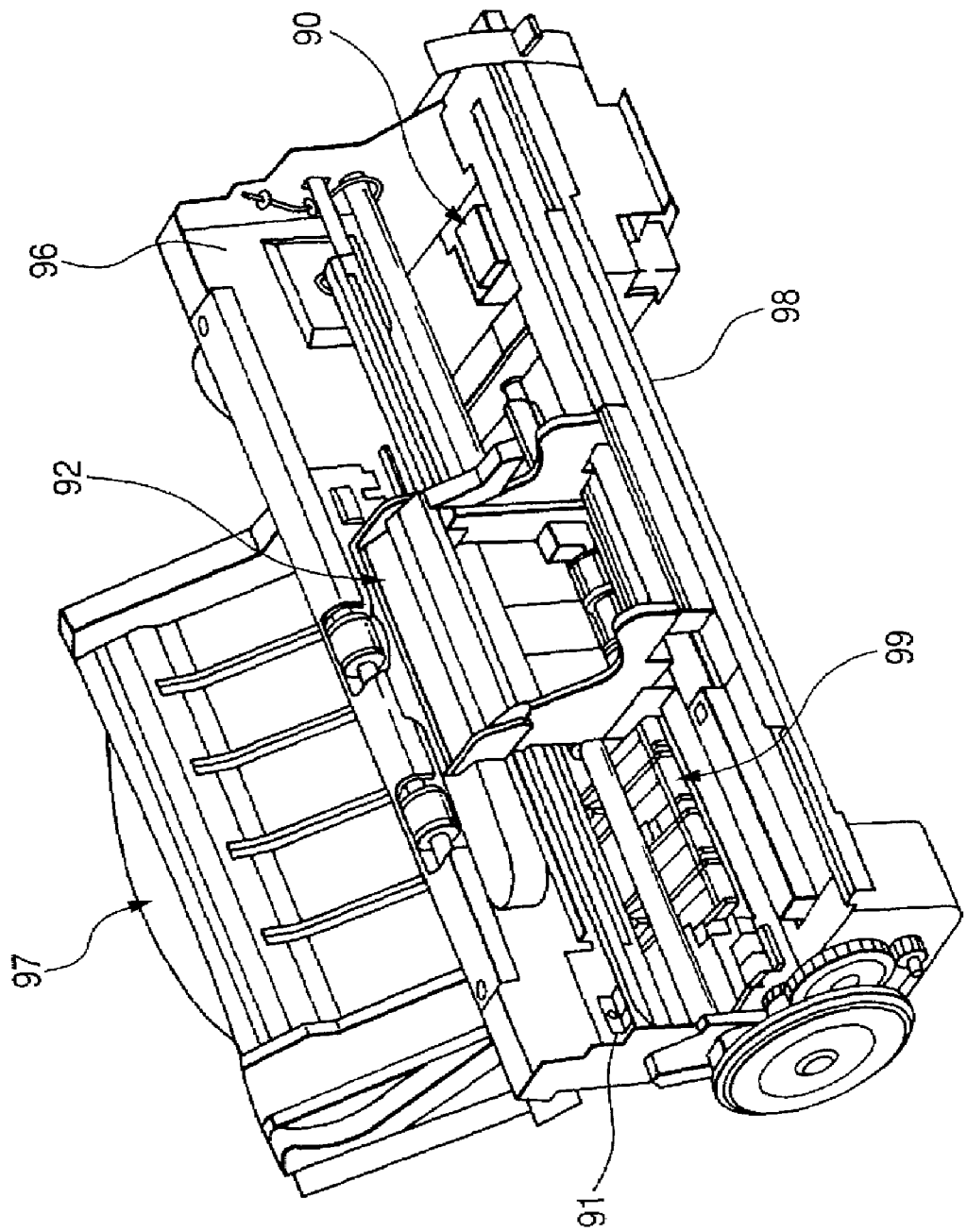
FIG. 4 is a perspective view showing one embodiment of a liquid discharge device according to the present embodiment.

A liquid discharge device according to the present embodiment can be applied to an inkjet recording device as an example. An example of the inkjet recording device includes an inkjet recording device having a motion mechanism section shown in FIG. 4. As is shown in FIG. 4, the inkjet recording device has an automatic feeding section 97 for automatically feeding recording paper of a recording medium into a main body 96 of the device. The inkjet recording device further has a transport section 99 for leading the recording paper fed from the automatic feeding section 97 to a predetermined recording position and leading it from the recorded position to an exhaust port 98; a recording section 91 for recording prints on the recording paper transported to the recording position; and a recovery section 90 for recovering the recording section 91. The recording section 91 is provided with a carriage 92 which accommodates a liquid discharge head according to the present embodiment and moves to-and-fro on a rail.

In a thus composed inkjet recording device, when a carriage 92 is transferred on a rail and driving voltage is applied to electrodes, with a piezoelectric substance sandwiched between them, by an electrical signal emitted from a computer, the piezoelectric substance displaces. The displacement of the piezoelectric substance pressurizes each piezoelectric chamber through a vibration plate, and makes ink discharge from a nozzle to produce prints.

A liquid discharge device according to the present embodiment can uniformly discharge droplets at high speed, and can be miniaturized.

The above described example was exemplified as a printer, but a liquid discharge device according to the present embodiment can be used as an inkjet recording device such as a facsimile, a compound machine and a copying machine, and further as a liquid discharge device for industrial use.

[Method for Producing Piezoelectric Substance]

A piezoelectric substance as is shown in FIG. 1 can be produced by the method of sequentially stacking layers of a plurality of different crystal phases of any of tetragonal, rhombohedral, pseudocubis, orthorhombic and monoclinic crystals with a sputtering technique. The process for achieving the above method includes the steps of: arranging a target having a plurality of piezoelectric materials placed on different regions; and sputtering the above described target while changing the region to be sputtered in the target.

Figure 5:
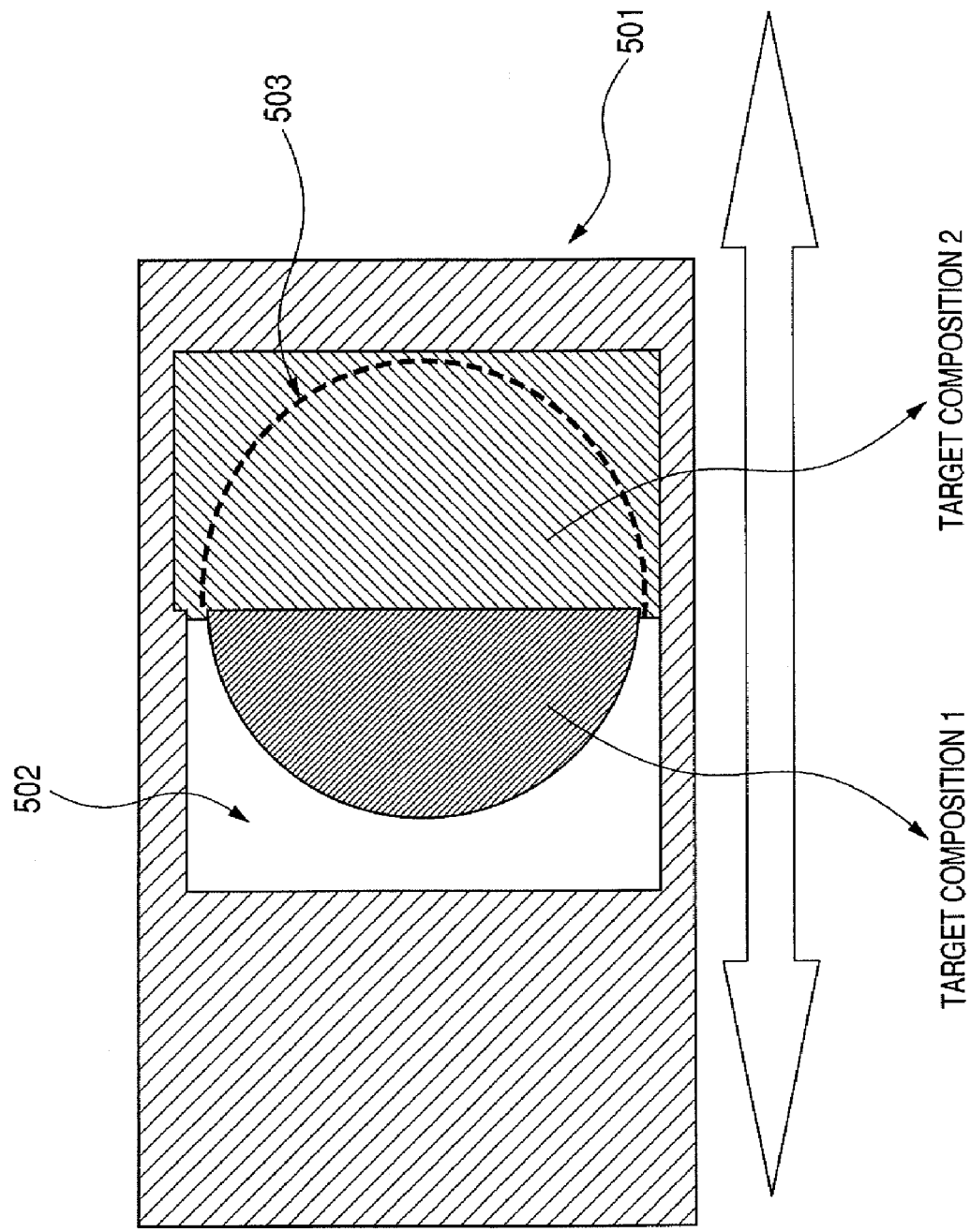
FIG. 5 is a schematic block diagram showing a relationship between a target and a shutter in a sputtering apparatus to be used in a method for producing a piezoelectric substance according to the present embodiment.

Such a sputtering method uses a chamber in which a substrate of a base for the piezoelectric substance is arranged so as to face a target formed of a piezoelectric material for forming the crystal phase, such as a sintered material preferably of the above described perovskite oxide ABO$_3$ or the like. After the inside of the chamber is highly evacuated, voltage is applied between the base and the target to generate glow discharge and ionize introduced argon gas or the like. Thus produced ions are further accelerated in a high electric field, and sputter the target to burst the elements from the target and make them grow on the base and form the crystal phase. When producing the piezoelectric substance particularly having periodically repeated layers of the different crystal phases, the target as shown in FIG. 5 is used, which has two piezoelectric materials of a target composition 1 and a target composition 2 for composing different crystal phases arranged respectively in divided different regions of the target region 503. An opening 502 of a shutter 501 is made to face the region formed of a desired piezoelectric material in the target. Only the region of the desired piezoelectric material is sputtered through the opening 502 for a predetermined period of time to make the bursting elements form a film on the substrate. Then, the shutter 501 is gradually transferred so that the opening 502 faces to the piezoelectric material region having another composition for forming the next crystal phase, while the sputtering is continued. The above operations are repeated to provide a piezoelectric substance having the multi-layer structure in which two crystal phases with different crystal structures, namely, different compositions, and a boundary layer between them are stacked. Furthermore, when producing the piezoelectric substance formed of a multi-layer structure consisting of periodically stacked layers of three different crystal phases, the target as shown in FIG. 6 is used, which has three piezoelectric materials of target compositions 1 to 3 for composing different crystal phases arranged respectively in tripartitioned different regions of the target region 503. When the regions of desired piezoelectric materials are sputtered by making the. opening 502 of the shutter 501 sequentially: and periodically face to each region, an obtained piezoelectric substance has a multi-layer structure in which the crystal phases of the target compositions 1 to 3 and the boundary layer between them are stacked.

The above described perovskite oxide $ABO_3$ to be used as a target can be obtained by, for instance, a sintering process or a method of preparing a powder of a desired composition.

A layer that is formed between layers having a determined crystal phase and has a crystal phase in which the crystal structure gradually changes in a thickness direction of the layer is produced by adjusting a traveling speed of a shutter which makes an opening face to-each of regions having different piezoelectric materials respectively placed therein. The crystal phase having the crystal structure gradually changing therein is produced by adjusting a traveling speed of a shutter equal to such a traveling speed of an opening as to make the formed film to form the crystal structure gradually changing in a thickness direction of a piezoelectric substance.

Thus provided piezoelectric substance has excellent piezoelectric characteristics, by possessing a single crystal structure or a uniaxial orientation structure as the whole of the piezoelectric substance, though the piezoelectric substance has a multi-layer structure consisting of a plurality of different layers. The above multi-layer structure can be formed by epitaxially growing each phase by the above described method.

[Method for Producing Piezoelectric Substance Element]

A usable method for producing a piezoelectric substance element according to the present embodiment includes a method of using a thin-film-forming technology. A vibration plate 42 in the piezoelectric substance element having the above described configuration can be produced by using a thin-film-producing method such as a sputtering method, a CVD method, a laser ablation method and a MBE method. When the vibration plate is produced particularly by the sputtering method, the oxide thin film obtained while sufficiently heating the film-formed substrate during the heating step shows epitaxial growth on a base 41.

In addition, a lower electrode 44 and an upper electrode to be stacked on a substrate 41 when the above described piezoelectric substance element is produced can be produced by using a thin-film-producing technology such as a sputtering method, a CVD method, a laser ablation method and a MBE method. By these methods, crystals in the film of an electrode material can be oriented in a particular direction. When using the above described film-forming, heating for the substrate during forming the film is important. The heating temperature can be, for instance, in a range of 500 to 700° C.

A buffer layer of the above described piezoelectric substance element can be produced from a buffer material by using the same method as in the method for producing an electrode.

[Method for Producing Liquid Discharge Head]

A usable method for producing a liquid discharge head according to the present embodiment can include a method of using a thin-film-forming technology. The liquid discharge head according to the present embodiment can be produced by the method of placing a separate liquid chamber (pressure chamber) 61 on a base 41 provided with a piezoelectric substance element having the above-described configuration, the method of placing the separate liquid chamber on another base and joining it to the piezoelectric substance element, or the like.

In the former method, a piezoelectric substance element is produced with the same method as described above, and recesses to become a plurality of separate liquid chambers are formed by removing one part of a base 41 at a fixed pitch. The recesses can be formed by using a process such as wet etching and dry etching using anisotropic etching and sand mill. A liquid discharge head can be produced by joining a nozzle plate 52 having nozzle 53 bored therein to the base 41 so as to correspond with the recesses, or joining a nozzle plate having the nozzle 53 and communicating holes formed therein to the base 41. A material of the nozzle plate may be the same material as the base to be joined or a different material such as SUS or Ni. The material preferably has a heat expansion coefficient close to that of the base to be joined within a difference of $1E-6/°$ C. to $1E-8/°$ C. The method for boring the nozzles in the nozzle plate can include processes such as etching, machining and laser irradiation.

A method for joining the above described base 41 with a nozzle plate 52 may be a method of using an organic adhesive, but preferably is a method of metallically jointing them through an inorganic material. A material to be used in the metallic jointing includes In, Au, Cu, Ni, Pb, Ti and Cr. These metallic materials are preferable because they can joint the above described base with the nozzle plate at a temperature as low as 250° C. or lower, has heat expansion coefficients close to that of the base, prevents a camber of an element when the element is elongated, and can inhibit the piezoelectric substance from being damaged.

In the next place, a liquid discharge head using the piezoelectric substance element and the piezoelectric substance according to the present embodiment will be specifically described. The technical range of a piezoelectric substance, a piezoelectric substance element and a liquid discharge head using them according to the present embodiment is not limited thereto.

Embodiment 1

A liquid discharge head was produced with the above described method.

First, a vibration plate was produced through forming a film of stabilized zirconia YSZ ($Y_2O_3$—$ZrO_2$) with the use of a sputtering apparatus (made by L-210-FH (ANELVA)) above an opening part of a Si substrate. In the above process, the vibration plate of a film consisting of uniaxial crystals and having a thickness of 200 nm was obtained by growing crystals on a Si substrate heated to 800° C. in conditions of using Ar and $O_2$ as an ionizing gas, applying an electric power 60 W between the Si substrate and a target, and controlling a pressure in the apparatus to 1.0 Pa.

Next, a lower electrode was produced by the same method as the method for producing a vibration plate. At this time, a Pt film consisting of highly uniaxial crystals with a film thickness of 400 nm was obtained by using Pt as a target, heating a substrate to 600° C., employing Ar for an ionizing gas, applying the electric power of 100 W between the vibration plate and the target, and controlling a pressure in an apparatus to 0.5 Pa.

Then, a target was prepared which has two types of perovskite oxides of target compositions (1) and (2) placed on different regions as is shown in FIG. 5, and was set in the above-described sputtering apparatus to be used. The film-forming operations were repeated which consist of forming a film on a substrate while facing an opening of a shutter to one composition region of the target and fixing it for a fixed period of time, and then forming a film after having moved the shutter so that the opening faced to the other composition region. Thus obtained piezoelectric substance has 20 layers of crystal phases each having the different compositions alternately stacked, and boundary layers in which a crystal structure gradually changed formed between the respective crystal phases. The piezoelectric substance was formed by heating a substrate to 650° C., using Ar and $O_2$ for ionizing gases, applying the electric power of 100 W between the electrode and the target, and controlling the pressure in the apparatus to 0.3 Pa. A period of time for sputtering the regions of the target compositions (1) and (2) were set at 8 min, and a period of time for forming the boundary layer while moving the opening of the shutter from one composition to the next composition was set at 2 min. Thus obtained piezoelectric substance consisted of a tetragon, a pseudocubic crystal and the mixed phase thereof which was the boundary layer as shown in FIG. 1, and had a film thickness of 3,000 nm.

The target compositions were as follows:

(1) $(Pb_{km}\alpha_{lm})_{xm}(Mg_{mm}Nb_{nm}Ti_{om}\beta_{pm})ymO_3$, wherein the suffixes satisfy $1 \leq xm/ym < 1.2$, km+lm=1, km=1, 1/=0, mm+nm+om+pm=1, mm=0.22, nm=0.44, om=0.33 and pm=0; and (2) $(Pb_{kz}\alpha_{lz})_{xz}(Zn_{mz}Nb_{nz}Ti_{oz}\beta_{pz})_{yz}O_3$, wherein the suffixes satisfy $1 \leq xz/yz < 1.2$, kz+lz=1, kz=1, lz=0, mz+nz+oz+pz=1, mz=0.30, nz=0.61, oz=0.09 and pz=0.

Subsequently, an upper electrode was produced by the same method as the method for producing the above described lower electrode.

Next, recesses were formed in the Si substrate by dry-etching a face opposite to a face provided with a vibration plate 42 by using ICP to remove central parts of the Si substrate. In the step, the substrate was controlled to 20° C., $SF_6$ and $C_4F_8$ gases were used, a RF power for a high-frequency coil was 1,800 W, and a pressure inside the apparatus was set at 4.0 Pa. A nozzle plate made from Si and provided with liquid outlets 53 was joined to the Si substrate having recesses formed therein by a Si—Si joining method. Thus produced liquid discharge head had the piezoelectric substance element containing the vibration plate with the length of 5,000 μm and the width of 100 μm.

A displacement magnitude of the obtained piezoelectric substance element was measured when the voltage of 20V and 10 kHz was applied to the element, and a discharged volume and discharge speed of droplets from the obtained liquid discharge head were measured. The results are shown in Table 1 and Table 2.

Embodiment 2

Figure 2:
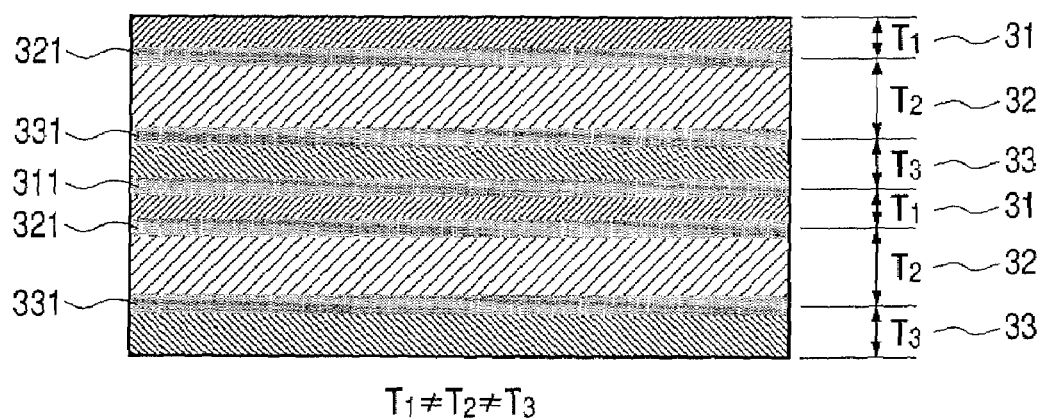
FIG. 2 is a schematic block diagram showing a layered configuration in one embodiment of a piezoelectric substance according to the present embodiment.

A liquid discharge head was produced by the same method as in Embodiment 1 except that the piezoelectric substance was produced with the use of a target having compositions shown below and the used target had the configuration shown in FIG. 6. The target had piezoelectric substance materials with respective compositions of the following (1) to (3) placed in tripartitioned regions as shown in FIG. 6. Periods of time for sputtering each composition region were respectively set at 15 min, 13 min and 11 min, and a period of time for forming a boundary layer while moving an opening of a shutter from one composition to the next composition was set at 2 min. Thus obtained piezoelectric substance was formed of a multi-layer structure with a film thickness of 3,000 nm consisting of 20 crystal phase layers each formed of a tetragon, a pseudocubic crystal and a monocline, and boundary layers which were the mixed phase of the above described crystal phases. As described above, it is possible to form a piezoelectric substance consisting of films of crystal phases with each different thickness as shown in FIG. 2, by varying a period of time for forming the film of each crystal phase.

The target compositions were as follows:

(1) $(Pb_{km}\alpha_{lm})_{xm}(Mg_{mm}Nb_{nm}Ti_{om}\beta_{pm})_{ym}O_3$, wherein the suffixes satisfy $1 \leq xm/ym < 1.2$, km+lm=1, km=1, 1=0, mm+nm+om+pm=1, mm=0.22, nm=0.44, om=0.33 and pm=0;

(2) $(Pb_{kz}\alpha_{lz})_{xz}(Zn_{mz}Nb_{nz}Ti_{oz}\beta_{pz})_{yz}O_3$, wherein the suffixes satisfy $1 \leq xz/yz < 1.2$, kz+lz=1, kz=1, lz=0, mz+nz+oz+pz=1, mz=0.30, nz=0.61, oz=0.09 and pz=0; and (3) $(Pb_{ky}\alpha_{ly})_{xy}(Yb_{my}Nb_{ny}Ti_{oy}\beta_{py})_{yy}O_3$, wherein $1 \leq xy/yy < 1.2$, ky+ly=1, ky=1, ly=0, my+ny+oy+py=1, my=0.25, ny=0.25, oy=0.50 and py=0.

The displacement magnitude of the obtained piezoelectric substance element and the discharged volume and discharge speed of droplets from the obtained liquid discharge head were measured with the same method as in Embodiment 1. The results are shown in Table 1 and Table 2.

Embodiment 3

A liquid discharge head was produced by the same method as in Embodiment 1 and 2 except that the piezoelectric substance was produced with the use of a target having compositions of (1) to (4) shown below and the used target had each piezoelectric material placed in quarter-partitioned regions. Periods of time for sputtering each composition region were respectively set at 20 min, 18 min, 16 min and 14 min, and a period of time for forming a boundary layer while moving an opening of a shutter from one composition to the next composition was set at 4 min. As a result, the obtained piezoelectric substance was-formed of a multi-layer structure with a film thickness of 3,000 nm consisting of 15 crystal phase layers each formed of a tetragon, a pseudocubis crystal and a monocline, and the boundary layers. Thus, it is possible to form a piezoelectric substance having a plurality of crystal phases having the objective film thickness each stacked, by appropriately changing the divided regions of the target and a sputtering period of time.

The target compositions were as follows:

(1) $(Pb_{kn}\mu_{ln})_{xn}(Nb_{mn}Nb_{nm}Ti_{on}\beta_{pn})_{yn}O_3$ (wherein the suffixes satisfy $1 \leq xn/yn < 1.5$, kn+ln=1, kn=0.9, ln=0.1, mn+nn+on+pn=1, mn=0.2, nn=0.4, on=0.35 and pn=0.05; θ is La; and β is In);

(2) $(Pb_{kt}\alpha_{lt})_{xt}(Sc_{mt}Ta_{nt}Ti_{ot}\beta_{pt})_{yt}O_3$ (wherein the suffixes satisfy $1 \leq xt/yt < 1.5$, kt+lt=1, kt=0.9, lt=0.1, mt+nt+ot+pt=1, mt=0.28, nt=0.28, ot=0.40 and pt=0.04; α is La; and β is Nb);

(3) $(Pb_{ki}\alpha_{li})_{xi}(In_{mi}Nb_{ni}Ti_{oi}\beta_{pi})_{yi}O_3$ (wherein the suffixes satisfy $1\leq xi/yi<1.5$, ki+li=1, ki=0.9, li=0.1, mi+ni+oi+pi=1, mi=0.23, ni=0.23, oi=0.50 and pi=0.04; α is La;. and β is Mg); and (4) $(Pb_{ks}\alpha_{ls})_{xs}(Sc_{ms}Nb_{ns}Ti_{os}\beta_{ps})_{ys}O_3$ (wherein the suffixes satisfy $1\leq xs/ys<1.5$, ks+ls=1, ks=0.9, ls=0.1, ms+ns+os+ps=1, ms=0.25, ns=0.25, os=0.43 and ps=0.07; α is La; and β is In).

The displacement magnitude of the obtained piezoelectric substance element and the discharged volume and discharge speed of droplets from the obtained liquid discharge head were measured with the same method as in Embodiment 1 and 2. The results are shown in Table 1 and Table 2.

COMPARATIVE EXAMPLE 1

A liquid discharge head was produced by the same method as in Embodiment 1 except that the piezoelectric substance was produced with the use of a sintered target having the composition of $(Pb_{1-x}M_x)(Zr_yTi_{1-y})O_3$, (wherein x=0 and y=0.50), and the substrate was heated to 600° C. Thus obtained piezoelectric substance, had a monolayer structure formed of a tetragon.

The displacement magnitude of the obtained piezoelectric substance element and the discharged volume and discharge speed of droplets from the obtained liquid discharge head were measured with the same method as in Embodiment 1.

TABLE 1

| | Embodiment 1 | Embodiment 2 | Embodiment 3 | Comparative Example 1 |
|---|---|---|---|---|
| Displacement magnitude (nm) | 0.65 | 0.70 | 0.80 | 0.30 |

As is shown in the above result, a piezoelectric substance element in Embodiment 1 showed the displacement magnitude of 0.65 nm. In addition, a piezoelectric substance element in Embodiment 2 showed the displacement magnitude of 0.70 nm. Furthermore, a piezoelectric substance element in Embodiment 3 showed the displacement magnitude of 0.80 nm. In contrast to this, a piezoelectric substance element in Comparative Example 1 showed the displacement magnitude of 0.30 nm.

TABLE 2

| | Embodiment 1 | Embodiment 2 | Embodiment 3 | Comparative Example 1 |
|---|---|---|---|---|
| Discharged volume (pl) | 20 | 22 | 25 | 12 |
| Discharge speed (m/sec) | 15 | 16 | 18 | 11 |

As is shown in the above result, a liquid discharge head when a voltage of 20 V (10 kHz) was applied in Embodiment 1 showed a discharged volume of 20 pl and a discharge speed of 15 m/sec. A liquid discharge head when a voltage of 20 V (10 kHz) was applied in Embodiment 2 showed a discharged volume of 22 pl and a discharge speed of 16 m/sec. A liquid discharge head when a voltage of 20 V (10 kHz) was applied in Embodiment 3 showed a discharged volume of 25 pl and a discharge speed of 18 m/sec. In contrast to this, a liquid discharge head in Comparative Example 1 showed a discharged volume and a discharge speed of 12 pl and 11 m/sec, respectively, which were lower values than those in the Embodiments.

In addition, as a result of having tested the durability of the liquid discharge heads, the liquid discharge head of the Embodiments did not produce any nondischarging nozzle even after $10^9$ times of tests, whereas the liquid discharge head of the Comparative Example produced nondischarging nozzles after $10^6$ to $10^7$ times of tests because of peeling.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-241397, filed Aug. 23, 2005, which is hereby incorporated by reference herein in its entirety.

What is claimed is:

1. A piezoelectric substance having a multi-layer structure comprising single crystal layers or uniaxial crystal layers of a perovskite oxide, expressed by a general formula of $ABO_3$ in which a main component at the site (A) is Pb, and a main component at the site (B) includes at least three elements selected from the group consisting of Mg, Zn, Sc, In, Yb, Ni, Nb, Ti and Ta, wherein the multi-layer structure comprises:

a first crystal phase layer having any crystal structure selected from the group consisting of tetragonal, rhombohedral, pseudocubic, orthorhombic and monoclinic crystals;

a second crystal phase layer having any crystal structure selected from the group consisting of tetragonal, rhombohedral, pseudocubic, orthorhombic and monoclinic crystals, but different from the crystal structure of the first crystal phase; and a boundary layer between the first crystal phase layer and the second crystal phase layer, and having a crystal structure gradually changing in a thickness direction of the layer.

2. The piezoelectric substance according to claim 1, wherein the $ABO_3$ of the perovskite oxide is expressed by $(Pb_{km}\alpha_{lm})_{xm}(Mg_{mm}Nb_{nm}Ti_{om}\beta_{pm})_{ym}O_3$, wherein the suffixes satisfy $1\leq xm/ym<1.5$, km+lm=1, $0.7\leq km\leq 1$, $0\leq lm\leq 0.3$, mm+nm+om+pm=1, 0.1<mm<0.3, 0.3<nm<0.5, 0.2<om<0.4 and $0\leq pm<0.3$; α includes any element of La, Ca, Ba, Sr, Bi or Sb; and β includes any element of Pb, Sc, In, Yb, Ni, Ta, Co, W, Fe, Sn or Zn.

3. The piezoelectric substance according to claim 1, wherein the $ABO_3$ of the perovskite oxide is expressed by $(Pb_{kz}\alpha_{lz})_{xz}(Zn_{mz}Nb_{nz}Ti_{oz}\beta_{pz})_{yz}O_3$, wherein the suffixes satisfy $1\leq xz/yz<1.5$, kz+lz=1, $0.7\leq kz\leq 1$, $0\leq lz\leq 0.3$, mz+nz+oz+pz=1, 0.2<mz<0.4, 0.5<nz<0.7, 0.05<oz <0.20 and $0\leq pz<0.3$; α includes any element of La, Ca, Ba, Sr, Bi or Sb; and β includes any element of Pb, Sc, In, Yb, Mg, Ta, Co, W, Fe, Sn or Ni.

4. The piezoelectric substance according to claim 1, wherein the $ABO_3$ of the perovskite oxide is expressed by $(Pb_{kn}\alpha_{ln})_{xn}(Ni_{mn}Nb_{nn}Ti_{on}\beta_{pn})_{yn}O_3$, wherein the suffixes satisfy $1\leq xn/yn<1.5$, kn+ln=1, $0.7\leq kn\leq 1$, $0\leq ln\leq 0.3$, mn+nn+on+pn=1, 0.1<mn<0.3, 0.3<nn<0.5, 0.3<on<0.5 and $0\leq pn<0.3$; α includes any element of La, Ca, Ba, Sr, Bi or Sb; and β includes any element of Pb, Sc, In, Yb, Mg, Ta, Co, W, Fe, Sn or Zn.

5. The piezoelectric substance according to claim 1, wherein the $ABO_3$ of the perovskite oxide is expressed by $(Pb_{kt}\alpha_{lt})_{xt}(Sc_{mt}Ta_{nt}Ti_{ot}\beta_{pt})_{yt}O_3$, wherein the suffixes satisfy $1\leq xt/yt<1.5$, kt+lt=1, $0.7\leq kt\leq 1$, $0\leq lt\leq 0.3$, mt+nt+ot+ pt=1, 0.1<mt<0.4, 0.1<nt<0.4, 0.3<ot<0.5 and 0≦pt<0.3; α includes any element of La, Ca, Ba, Sr, Bi or Sb; and β includes any element of Pb, Nb, In, Yb, Mg, Ni, Co, W, Fe, Sn or Zn.

6. The piezoelectric substance according to claim 1, wherein the $ABO_3$ of the perovskite oxide is expressed by $(Pb_{ks}\alpha_{ls})_{xs}(Sc_{ms}Nb_{ns}Ti_{os}\beta_{ps})_{ys}O_3$, wherein the suffixes satisfy $1\leq xs/ys<1.5$, $ks+ls=1$, $0.7\leq ks\leq 1$, $0\leq ls\leq 0.3$, $ms+ns+os+ps=1$, $0.1<ms<0.4$, $0.1<ns<0.4$, $0.3<os<0.5$ and $0\leq ps<0.3$; α includes any element of La, Ca, Ba, Sr, Bi or Sb; and β includes any element of Pb, Ta, In, Yb, Mg, Ni, Co, W, Fe, Sn or Zn.

7. The piezoelectric substance according to claim 1, wherein the $ABO_3$ of the perovskite oxide is expressed by $(Pb_{ky}\alpha_{ly})_{xy}(Yb_{my}Nb_{ny}Ti_{oy}\beta_{py})_{yy}O_3$, wherein the suffixes satisfy $1\leq xy/yy<1.5$, $ky+ly=1$, $0.7\leq ky\leq 1$, $0\leq ly\leq 0.3$, $my+ny+oy+py=1$, $0.1<my<0.4$, $0.1<ny<0.4$, $0.4<oy<0.6$ and $0\leq py<0.3$; α includes any element of La, Ca, Ba, Sr, Bi or Sb; and β includes any element of Pb, Sc, In, Ta, Mg, Ni, Co, W, Fe, Sn or Zn.

8. The piezoelectric substance according to claim 1, wherein the $ABO_3$ of the perovskite oxide is expressed by $(Pb_{ki}\alpha_{li})_{xi}(In_{mi}Nb_{ni}Ti_{oi}\beta_{pi})_{yi}O_3$, wherein the suffixes satisfy $1\leq xi/yi<1.5$, $ki+li=1$, $0.7\leq ki\leq 1$, $0\leq li\leq 0.3$, $mi+ni+oi+pi=1$, $0.2<mi<0.4$, $0.2<ni<0.4$, $0.2<oi<0.5$ and $0\leq pi<0.3$; α includes any element of La, Ca, Ba, Sr, Bi or Sb; and β includes any element of Pb, Sc, In, Yb, Mg, Ni, Co, W, Fe, Sn or Zn.

9. A piezoelectric substance element having a piezoelectric substance and a pair of electrodes, wherein the piezoelectric substance has a multi-layer structure, consisting of single crystal layers or uniaxial crystal layers of a perovskite oxide, expressed by a general formula of $ABO_3$ in which a main component at the site (A) is Pb, and a main component at the site (B) includes at least three elements selected from the group consisting of Mg, Zn, Sc, In, Yb, Ni, Nb, Ti and Ta, wherein the multi-layer structure comprises:

a first crystal phase layer having any crystal structure selected from the group consisting of tetragonal, rhombohedral, pseudocubic, orthorhombic and monoclinic crystals;

a second crystal phase layer having any crystal structure selected from the group consisting of tetragonal, rhombohedral, pseudocubic, orthorhombic and monoclinic crystals, but different from the crystal structure of the first crystal phase; and a boundary layer between the first crystal phase layer and the second crystal phase layer, and having a crystal structure gradually changing in a thickness direction of the layer.

10. A liquid discharge head which has separate liquid chambers each communicating with a nozzle and piezoelectric substance elements each including a piezoelectric substance and a pair of electrodes arranged so as to correspond to the separate liquid chambers, and discharges a liquid in the separate liquid chamber from the corresponding nozzle, wherein the piezoelectric substance has a multi-layer structure, consisting of single crystal layers or uniaxial crystal layers of a perovskite oxide, expressed by a general formula of $ABO_3$ in which a main component at the site (A) is Pb, and a main component at the site (B) includes at least three elements selected from the group consisting of Mg, Zn, Sc, In, Yb, Ni, Nb, Ti and Ta, wherein the multi-layer structure comprises:

a first crystal phase layer having any crystal structure selected from the group consisting of tetragonal, rhombohedral, pseudocubic, orthorhombic and monoclinic crystals;

a second crystal phase layer having any crystal structure which is selected from the group consisting of tetragonal, rhombohedral, pseudocubic, orthorhombic and monoclinic crystals, but is different from the crystal structure of the first crystal phase layer; and a boundary layer between the first crystal phase layer and the second crystal phase layer, and having a crystal structure gradually changing in a thickness direction of the layer.

11. A liquid discharge device having a liquid discharge head for discharging a liquid, wherein a piezoelectric substance element for generating energy for discharging the liquid has a piezoelectric substance and a pair of electrodes, wherein the piezoelectric substance has a multi-layer structure, consisting of single crystal layers or uniaxial crystal layers of a perovskite oxide, expressed by a general formula of $ABO_3$ in which a main component at the site (A) is Pb, and a main component at the site (B) includes at least three elements selected from the group consisting of Mg, Zn, Sc, In, Yb, Ni, Nb, Ti and Ta, wherein the multi-layer structure comprises:

a first crystal phase layer having any crystal structure selected from the group consisting of tetragonal, rhombohedral, pseudocubic, orthorhombic and monoclinic crystals;

a second crystal phase layer having any crystal structure which is selected from the group consisting of tetragonal, rhombohedral, pseudocubic, orthorhombic and monoclinic crystals, but is different from the crystal structure of the first crystal phase layer; and a boundary layer between the first crystal phase layer and the second crystal phase layer, and having a crystal structure gradually changing in a thickness direction of the layer.

* * * * *